United States Patent [19]
Enichen et al.

[11] Patent Number: 6,040,095
[45] Date of Patent: Mar. 21, 2000

[54] MEASUREMENT MARKS FOR E-BEAM PROJECTION MASK AND METHOD OF USING

[75] Inventors: William A. Enichen, Poughkeepsie; Christophe F. Robinson, Hyde Park, both of N.Y.

[73] Assignee: Nikon Corporation, Tokyo, Japan

[21] Appl. No.: 09/163,406

[22] Filed: Sep. 30, 1998

[51] Int. Cl.[7] .................................................. G03F 9/00
[52] U.S. Cl. .................................. 430/5; 430/22; 430/30; 430/296
[58] Field of Search .................................. 430/5, 22, 30, 430/296

Primary Examiner—Christopher G. Young
Attorney, Agent, or Firm—Whitham, Curtis & Whitham

[57] ABSTRACT

Measurement marks are applied throughout the area of an e-beam projection mask on a grillage of struts extending between sub-field membrane mask areas concurrently with patterning the sub-field membrane mask areas. The thickness of the struts prevents printing of the measurement marks on the resist at the target plane even if inadvertently illuminated by the e-beam system. Measurement of the relative locations of the measurement marks after fabrication and incremental periods of use supports the development of compensation or correction in the electron-optical system for distortions of the mask which may be detected from the measurement marks by adjustment of operating parameters thereof.

17 Claims, 2 Drawing Sheets

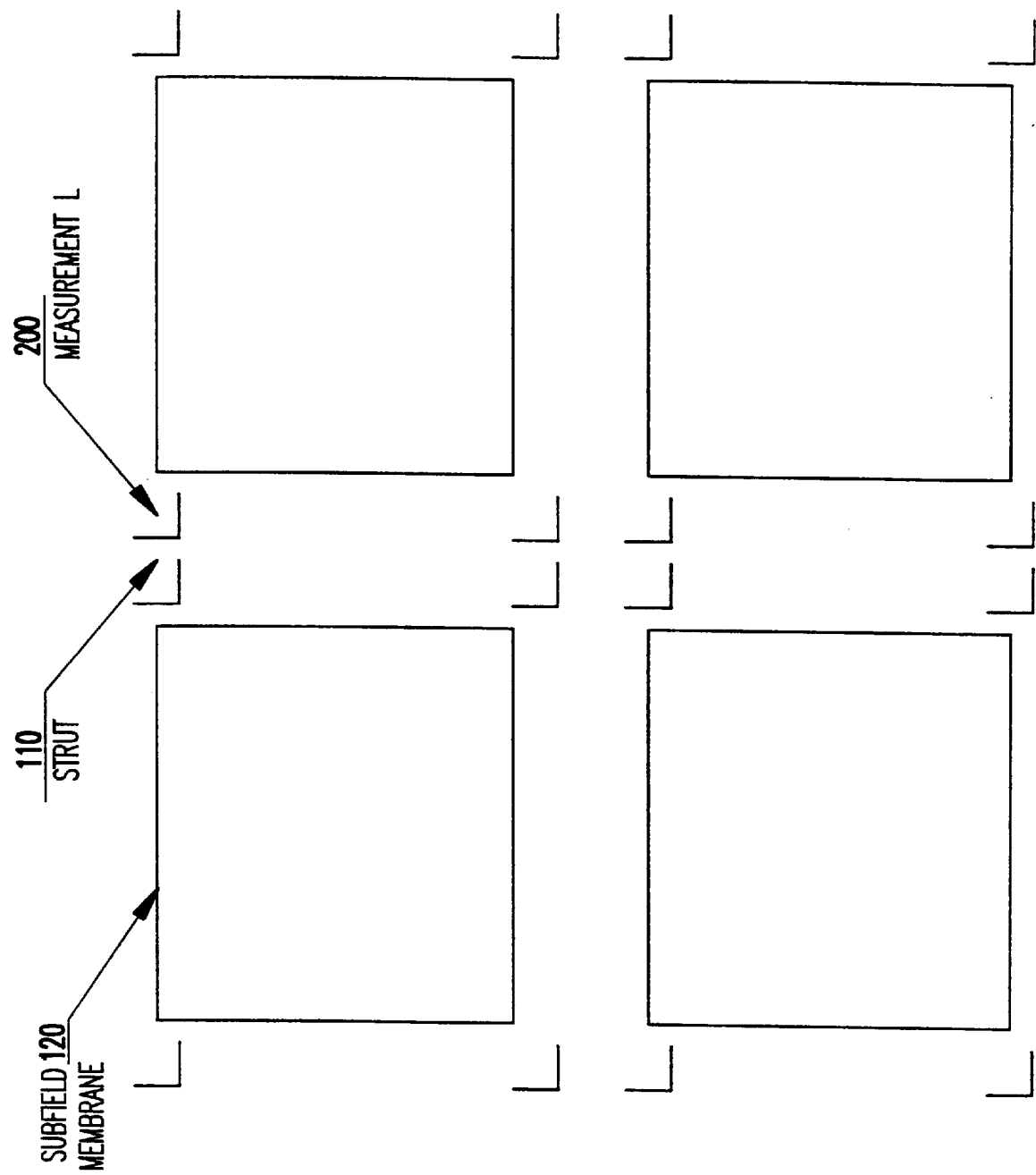

MEASUREMENT MARKS FOR E-BEAM PROJECTION MASK AND METHOD OF USING

BACKGROUND OF THE INVENTION

1. Field of the Invention

The present invention generally relates to charged particle beam projection lithography tools and, more particularly, to electron beam (e-beam) projection masks or reticles.

2. Description of the Prior Art

Numerous lithography techniques are known and are in widespread use for manufacture of integrated circuit devices, in particular. Essentially, such lithography processes define potentially very minute areas and shapes on a surface through selective exposure and removal of portions of a layer of resist to expose areas of a surface for further processing by, for example, etching, implantation and/or deposition. Exposure has generally been accomplished in the past by use of radiant energy such as visible wavelength light.

There is a strong incentive in the manufacture of integrated circuits to increase integration density to the greatest possible degree consistent with acceptable manufacturing yields. Device arrays of increased density provide increased performance since signal propagation time is reduced with reduced connection length and capacitance. Further, increased device density on a chip allows greater chip functionality as well as greater numbers of devices which can be manufactured on a chip of a given area. Accordingly, increased integration density reduces manufacturing costs by maximizing the number of devices (or the number of chips of a particular functionality) which can be formed in the course of processing a single wafer of a given size. That is, for a given processing schedule, the cost of processing each wafer (including amortization and maintenance of the tools and processing reactor vessels) is substantially constant regardless of the number of devices or chips simultaneously formed.

While electromagnetic radiation (EMR) has been widely used in the past for exposure of lithographic resists, resolution is limited by the wavelength of the radiation employed. To produce very small feature sizes for high integration density, deep ultra-violet (DUV), extreme ultraviolet (EUV) and x-rays have been investigated for exposure of lithographic resists. However, it is generally considered that EMR is not suitable for minimum feature size regimes at or below one-tenth micron. To resolve such minimum feature sizes, charged particle beams are generally believed to be required. Electron beams are generally preferred since the much lower mass of electrons, relative to ions allows the beam to be readily controlled with relatively lower power requirements of the exposure tool optical elements.

However, to be economically viable for production of integrated circuits, electron beam tools must have throughput which is comparable to EMR lithography exposure tools. To achieve such throughput, exposure must be accomplished over relatively large sub-fields often containing one million pixels or more by projection of a pattern formed on a reticle or mask placed in the electron beam path. The masks must be formed with extremely high dimensional accuracy so that the sub-field patterns can be accurately abutted or "stitched" together into a larger continuous pattern.

Masks for electron beam projection rely on scattering of electrons predominantly by one of two basic mechanisms and are thus of one of two basic physical types. Aperture or stencil masks have a thin membrane, generally of silicon, corresponding to sub-field areas which are respectively patterned by etching of holes therein. While the membrane of aperture masks is thin enough for electrons to penetrate, the electrons penetrating the membrane are scattered sufficiently to be intercepted by a contrast aperture before reaching the target while electrons penetrating an aperture reach the target unimpeded.

The other type of mask has a continuous membrane of a material, such as silicon nitride, which is much thinner than the membrane of an aperture mask such that electrons can readily penetrate the membrane without significant scattering. The membrane is patterned with a pattern of material such as tantalum formed thereon which is capable of strongly scattering electrons which are incident on the pattern of material. A separate contrast aperture is generally used with this latter type of scattering mask, as well, to collect strongly scattered electrons and prevent them from reaching the target.

Both types of mask are generally constructed from a relatively thick sheet of material which is reduced in thickness (e.g. by etching) in the sub-field areas to form mask membrane areas. The remaining relatively thick material between the sub-field membrane areas thus defines a crosshatch pattern or grillage of thicker material; portions of which are referred to as struts. The grillage pattern provides mechanical support to the membrane areas and a path to thermal ground for the few electrons absorbed in the thin membrane.

The beam is sized, shaped and positioned to fill the sub-field membrane areas with little or no electron impingement on the struts. As is known, electron absorption by any portion of the mask will cause heating which, in turn, increases the risk of thermal distortion of the mask. Thermal cycling and large temperature excursions can also cause persistent distortions of the mask and/or the sub-field membrane areas thereof. Additionally, while masks are made with extremely high precision, distortions may occur in the mask, as fabricated, when material is removed or deposited in the desired pattern and internal stresses in the mask are thus altered. Thermal cycling can also alter internal stresses in the mask which may result in or contribute to mask distortion.

The quality of the projection mask is critical to implementation of projection e-beam lithography. It can be readily understood that the distortion of the mask must be held to a small fraction of the feature size or pitch (e.g. in the mask itself or referred to the target plane since demagrification is usually employed) if exposures of sub-fields are to stitch together properly. Distortions due to temperature, however, are superimposed on any distortions in the mask, as fabricated, and persistent distortions which may occur through use of the mask in the e-beam exposure tool. Therefore, it is necessary to evaluate the mask periodically to determine the extent of persistent distortion which may have occurred during use and to evaluate the quality of the mask periodically over its useful lifetime.

It is known to provide registration and measurement marks on masks in regions which correspond to the kerf between chips on a wafer. This location is chosen because measurement marks on known exposure masks also results in exposure of resist on the wafer corresponding to the measurement mark. However, when sub-field exposures are made and stitched together, such exposure would overlap another sub-field and thus cannot be readily accommodated without compromising the design and layout of the chip and consuming significant chip space. By the same token, measurement marks provided only at the perimeter of the mask do not reveal distortions which may occur in sub-fields and which may partially compensate each other over the dimensions of the entire mask.

Accordingly, prior mask structures and designs do not provide measurement marks which avoid printing of the measurement mark on the wafer or provide for detection, much less allowing optical correction or compensation, of local (e.g. sub-field) distortion of the mask. Therefore, known mask structures and designs do not allow initial assessment or evaluation and/or monitoring of the quality of the mask, which is critical to high throughput e-beam projection lithography at small feature size and fine pitch.

SUMMARY OF THE INVENTION

It is therefore an object of the present invention to provide an e-beam projection mask which has measurement marks which reveal sub-field distortion without resulting in exposure of the target with an image of the measurement mark.

It is another object of the invention to support provision of sub-field mask distortion correction or compensation in an electron-optical system.

It is a further object of the invention to provide monitoring of mask quality over the useful lifetime of the mask.

It is yet another object of the invention to support extended useful lifetime of an e-beam projection mask by determination of corrections for measured distortions therein.

In order to accomplish these and other objects of the invention, a charged particle beam projection mask is provided which includes a plurality of patterned sub-field membrane mask areas, a grillage of struts extending between and supporting the membrane mask areas, and a plurality of measurement marks corresponding in number to said plurality of the sub-field membrane mask areas and located on the grillage of struts adjacent to the sub-field membrane mask areas and formed concurrently with patterning of the sub-field membrane mask areas in the same process so that the locations of the measurement marks are associated with the locations of features of the sub-field mask area patterns.

In accordance with another aspect of the invention, a method of operating an charged particle beam projection lithography system is provided including the steps of fabricating a mask having a plurality of measurement marks corresponding in number to a plurality of patterned sub-field membrane mask areas and located on a grillage of struts adjacent to said sub-field membrane mask areas, said measurement marks being formed concurrently and in the same process by which said sub-field membrane mask areas are patterned, measuring distortions of said mask based on locations of said measurement marks, and generating corrections of operating parameters of said e-beam projection lithography system in accordance with measured distortions of said locations of said measurement marks.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a plan view of the E-beam projection mask of FIG. 1 including measurement marks in accordance with a preferred embodiment of the invention.

DETAILED DESCRIPTION OF A PREFERRED EMBODIMENT OF THE INVENTION

Figure 1:
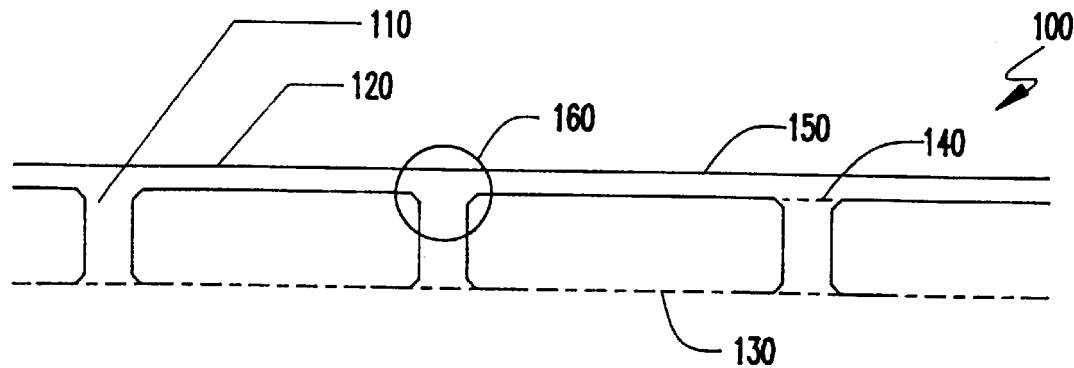
FIG. 1 is a cross-sectional view of an e-beam projection mask in accordance with the invention.

Referring now to the drawings, and more particularly to FIG. 1, there is shown, in cross-section, a mask 100 in accordance with the invention and suitable for use in an e-beam lithography tool. It should be understood that in the cross-sectional view of FIG. 1, the depiction of the mask resembles masks currently in use since the measurement marks in accordance with the invention are not visible in this view but are depicted in the enlargement of region 160 of FIG. 1 shown in FIGS. 1A and 1B. However, no portion of any Figure is admitted to be prior art in regard to the present application. It should also be understood that both FIGS. 1 and 2 are not to scale and illustrate basic features which are common to both types of scattering masks discussed above and the application of the invention thereto. The patterning of the membrane areas is not illustrated in the interest of clarity and since it is arbitrary in regard to the principles of the invention.

Mask 100 is preferably formed from a wafer (generally of an initial thickness of about 320 microns but which is not at all critical to the practice of the invention) of silicon. A layer 140 of silicon nitride formed on a silicon wafer as indicated by dashed line 140 can be used and is preferred for masks having very thin membranes and deposited scattering materials. Other suitable materials and combinations of materials will be evident to those skilled in the art.

(In this regard and as will be recognized by those skilled in the art, silicon nitride exhibits an etch rate which is distinctly different from the etch rate of silicon for many etchants. A similar effect can be produced in silicon to a readily controllable depth within the wafer by, for example, implantation of boron. For this reason, it is preferred but not critical to the practice of the invention to etch the sub-field areas to form the membrane subsequent to the patterning of the sub-field areas, as will be discussed in greater detail below, regardless of the type of scattering mask which is formed.)

The wafer is etched from surface 130 in the sub-field areas to a thin (e.g. about 2.0 microns for an aperture or stencil mask and about 0.2 microns for a mask using deposited scattering material) membrane 120 at surface 150 which will be masked, patterned in the membrane areas and etched to form apertures in desired sub-field patterns or, alternatively, have a layer of tantalum or other scattering material deposited thereon which is later etched to form the desired sub-field pattern. Of course, other processes could also be used to form the scattering sub-field pattern. Formation of the membranes 120 at the sub-field areas thus leaves the full thickness of the wafer in the regions between the sub-field areas which form struts 110 that serve to support the membrane regions 120.

Referring now to FIG. 2, a plan view of a portion of the reticle or mask in accordance with the invention is shown. The sub-field area membrane regions 120 are preferably rectangular but other shapes which will form images that can fully tile the chip surface (e.g. hexagons) can be used. The regions between the sub-field area membranes 120 form a grillage of struts 110 which provide structural robustness to the entire mask and support the membrane areas at their edges.

Each sub-field is preferably surrounded by four measurement marks 200. These marks can be shared by adjacent sub-fields or four marks can be dedicated to an individual sub-field. Measurement in the X and Y directions of the four marks associated with an individual sub-field allow characterization of the sub-field in terms of X and Y displacement, X and Y magnification error compared to nominal, rotation and orthogonality error and X and Y trapezoid error. Fewer marks per sub-field could be used in accordance with the basic principles of the invention but fewer types of distortions would be characterized.

These marks are preferably shaped in the form of an "L" since preferred X-Y metrology tools such as the commercially available Nikon 3i or the Leitz LMS 2000 are particularly efficient for detecting that particular shape. Other shapes could be used and may be preferred for other metrology tools but generally should include orthogonal pairs of parallel edges. Marks could possibly be combined into shapes having edges referenced to adjacent sub-field membrane areas.

Figure 1A:
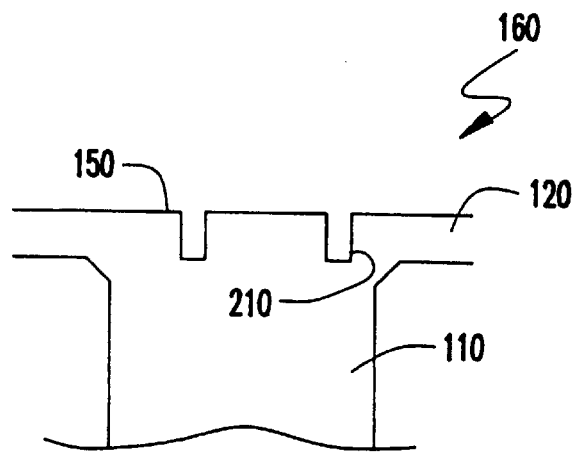
FIG. 1A is an enlarged cross-sectional view of portion 160 of FIG. 1 illustrating application of the invention to an aperture mask.
Figure 1B:
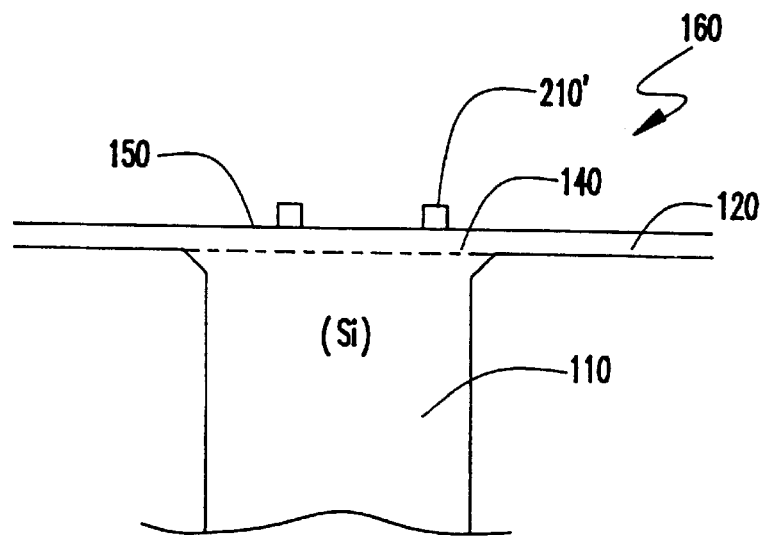
FIG. 1B is an enlarged cross-sectional view of portion 160 of FIG. 1 illustrating application of the invention to a mask having a strongly scattering material deposited thereon.

These marks are preferably formed by the same process (e.g. etching for an aperture mask to form depressions 210 of FIG. 1A, deposition and patterning of scattering material, as depicted by dashed line 210' of FIG. 1B) which is used to pattern the sub-field membrane areas which serves the dual purpose of avoiding additional process and alignment steps and necessarily referencing the measurement marks 200 to the sub-field pattern, however formed. For this reason, it is preferred to carry out the sub-field patterning process, including the formation of measurement marks 200 from planar side 150 of the wafer.

While not critical to the practice of the invention, the measurement marks are, as mentioned above, in the form of an "L" with horizontal and vertical portions of equal length and width, preferably 20 $\mu$m long and 2.5 $\mu$m wide (in the mask plane). Mark dimensions are, in any event, preferably chosen to be compatible with the capabilities of the measurement tool.

It should be appreciated that the measurement marks are formed over struts 110 which is relatively thick in comparison with the membrane regions 120. Accordingly, while it is not intended that the strut regions and measurement marks thereon will be illuminated during the lithography process (to minimize electron absorption and heating of the mask), the measurement marks will not print to the resist even if illumination of the measurement marks inadvertantly occurs due to the thickness of the struts which will effectivly prevent transmission of the electron beam even in silicon nitride scattering masks.

It should also be appreciated that distortions of the mask, as fabricated, will be evident and can be quantitatively evaluated immediately after the mask is formed. The ability to measure such distortions allows a relatively large, if not complete, degree of optical compensation or correction of the distortion to be achieved in the electron-optical system. It is preferred, as a practical matter and to avoid complication of the charged particle beam projection tool, to perform measurements of distortion while the mask or reticle is detached from the lithography tool. In view of the high accuracy of the metrology tool, changes in mask distortion during charged particle beam projection are relatively minor compared to distortions occurring during mask fabrication and persistent distortions occurring over a period of use.

Periodic evaluation of the quality of the mask (e.g. after an incremental period of use) thus not only serves to monitor the development of distortions of the mask but, as in the initial measurement and evaluation process after fabrication and before use, can provide an updated set of corrections or compensations which can be provided by the electron-optical system. Thus the useful lifetime of the expensive mask structure can generally be extended since the mask continues to be usable as long as sufficient correction of distortion of the sub-fields can be achieved to allow the sub-fields to be adequately stitched together or tessellated.

Additionally, it should be appreciated that the measurement marks and mask in accordance with the invention provide many more measurement marks than have been available in previous mask designs and that these additional marks are distributed throughout the mask area and yet do not result in exposure (i.e. of the resist) at the target plane. Therefore, the quality of the mask can be more thoroughly and quantitatively evaluated at any point in time and at the level of a sub-field which has not heretofore been possible. This detailed evaluation of distortions allows correction or compensation of the distortion for individual sub-fields which, similarly, has not heretofore been possible.

In view of the foregoing, it is seen that the mask including measurement marks in accordance with the invention provides an e-beam projection mask which reveals sub-field distortion without resulting in exposure of the target with an image of the measurement mark, supports provision of sub-field mask distortion correction or compensation in an electron-optical system, provides monitoring of mask quality over the useful lifetime of the mask and can effectively extend the useful lifetime of an e-beam projection mask by determination of corrections for measured distortions therein.

While the invention has been described in terms of a single preferred embodiment, those skilled in the art will recognize that the invention can be practiced with modification within the spirit and scope of the appended claims.

Having thus described my invention, what we claim as new and desire to secure by letters patent is as follows:

1. A charged particle beam projection mask including:
   a plurality of patterned sub-field membrane mask areas,
   a grillage of struts extending between and supporting said membrane mask areas, and
   a plurality of measurement marks corresponding in number to said plurality of said sub-field membrane mask areas and located on said grillage of struts adjacent to said sub-field membrane mask areas and formed concurrently with patterning of said sub-field membrane mask areas in the same process.

2. A mask as recited in claim 1, wherein said mask is formed of silicon.

3. A mask as recited in claim 2, wherein said sub-field membrane mask areas are formed of boron doped silicon.

4. A mask as recited in claim 1, wherein said mask is formed of a layer of silicon nitride on a silicon wafer.

5. A mask as recited in claim 4, wherein said sub-field membrane mask areas are silicon nitride and said grillage is a layered structure of silicon and silicon nitride.

6. A mask as recited in claim 1, wherein said measurement marks include orthogonal pairs of parallel edges.

7. A mask as recited in claim 1, wherein said measurement marks are etched into a planar surface of said mask.

8. A mask as recited in claim 1, wherein said measurement marks are formed of a material deposited on a planar surface of said mask.

9. A mask as recited in claim 1, wherein a thickness of said grillage is sufficient to be opaque to charged particles.

10. A method of operating a charged particle beam projection lithography system including the steps of:

fabricating a mask having a plurality of measurement marks corresponding in number to a plurality of patterned sub-field membrane mask areas and located on a grillage of struts adjacent to said sub-field membrane mask areas, said measurement marks being formed concurrently and in the same process by which said sub-field membrane mask areas are patterned, measuring distortions of said mask based on locations of said measurement marks, and generating corrections of operating parameters of said e-beam projection lithography system in accordance with measured distortions of said locations of said measurement marks.

11. A method as recited in claim 10, wherein said step of measuring distortions is performed with a metrology tool when said mask is detached from said charged particle beam projection lithography system.

12. A method of making a charged particle beam projection lithography mask including the steps of:

concurrently forming a pattern in sub-field membrane areas of said mask and measurement marks located adjacent to said sub-field membrane areas of said mask in the same process, and forming sub-field membranes in said sub-field membrane areas with a grillage of struts extending between said sub-field membrane areas.

13. A method as recited in claim 12, including the further step of implanting boron in a silicon wafer.

14. A method as recited in claim 12, including the further step of forming a layer of silicon nitride on a silicon wafer.

15. A method as recited in claim 12, wherein said step of forming said sub-field membranes is performed subsequently to said process.

16. A method as recited in claim 12, wherein said process is performed by etching.

17. A method as recited in claim 12, wherein said process is performed by depositing a material.

* * * * *